United States Patent [19]

Harada

[11] Patent Number: 5,798,141
[45] Date of Patent: Aug. 25, 1998

[54] METHOD FOR SEMICONDUCTOR FILMING

[75] Inventor: Toru Harada, Tokyo, Japan

[73] Assignee: Kokusai Electric Co., Ltd., Tokyo, Japan

[21] Appl. No.: 571,538

[22] Filed: Dec. 13, 1995

[30] Foreign Application Priority Data

Dec. 19, 1994 [JP] Japan ................. 6-334400

[51] Int. Cl.$^6$ ................. C23C 16/00; H01L 21/31
[52] U.S. Cl. ................. 427/248.1; 427/255.4; 427/255.1; 438/770
[58] Field of Search ................. 427/248.1, 255.4, 427/255.1, 255; 438/770, 769, 787

[56] References Cited

FOREIGN PATENT DOCUMENTS 05-032500   2/1993   Japan.
06-283712   10/1994  Japan.

Primary Examiner—Roy V. King
Attorney, Agent, or Firm—Graham & James LLP

[57] ABSTRACT

A method of semiconductor filming wherein a thin film is deposited on a wafer under an atmospheric pressure, which comprises the steps of simultaneously supplying a reactive gas and an inert gas to a reaction tube and maintaining a partial pressure of the reactive gas constant by adjusting the flow rates of those gases, whereby stability in film quality is improved.

7 Claims, 2 Drawing Sheets

1

METHOD FOR SEMICONDUCTOR FILMING

TECHNICAL BACKGROUND

The present invention relates generally to a system for producing a semiconductor and in particular to a method and apparatus for semiconductor filming wherein a thin film, such as an oxidation film, is deposited on a surface of a silicon wafer.

Semiconductor manufacture involves a step wherein an oxidation film is generated as an insulation film on a wafer surface, which step is carried out by means of an oxidation system. A known oxidation system will be explained hereunder with reference to FIG. 3.

Inside a reaction tube 1, there is provided a boat 3 carrying a lot of horizontally oriented wafers 2 laid in a multi-storied fashion. The boat 3 is vertically disposed, via a boat stand 5, on a furnace opening cover 4 which airtightly covers a lower end of the reaction tube 1. In a ceiling of the reaction tube 1, there are provided a plurality of gas introduction holes 6 communicating with a gas introduction pipe 7. An exhaust pipe 8 communicates with the inside of the reaction tube 1 at a lower part thereof. The gas introduction pipe 7 is connected to a source of oxygen gas not shown and has a valve 9 and a flow rate adjuster 10 thereabove.

Referring to FIG. 4, oxidation operation in the known system will now be explained.

The wafer 2 being loaded on the boat 3 is introduced into the reaction tube 1. The internal temperature of the reaction tube 1 is elevated at a rate of 5°–10°C./min to a preset temperature (900° C. in FIG. 4) and maintained at that temperature. The exhaust pipe 8 is opened to feed oxygen from the gas introduction pipe 7 into the reaction tube 1 to thereby oxidize the wafer 2 surface. Upon completion of the oxidation process, the gas is exhausted from the exhaust pipe 8.

After the oxidation process is completed, the internal temperature is lowered at a rate of 2°–5° C./min to a predetermined temperature, e.g., 800°C. and maintained at that temperature. After lapsing of a predetermined time period, the boat 3 is taken out of the reaction tube 1.

Since the exhaust gas is eventually exhausted to the atmosphere, the back pressure of the exhaust gas is greatly influenced by the atmosphere. Thus, internal pressure of the reaction tube 1 is liable to be influenced by the atmospheric pressure. Further, since the oxidation rate of the wafer depends on the absolute pressure of oxygen, a change in the atmospheric pressure leads to a change in the absolute pressure, and the oxidation rate changes as the atmospheric pressure changes. Consequently, there has been a problem that the quality of the oxidation process varies depending on the atmospheric pressure during such process and thus becomes unstable.

SUMMARY OF THE INVENTION

It is therefore an object of the present invention to maintain an absolute pressure of a reaction gas during a process such as an oxidation process to thereby achieve improved stability in product quality.

According to one aspect of the present invention, the above object is met by a method of semiconductor filming wherein a thin film is deposited on a wafer under an atmospheric pressure, the method comprising the steps of simultaneously supplying a reactive gas and an inert gas to a reaction tube and maintaining a partial pressure of the reactive gas constant.

In one particular form of the method, a flow rate of the inert gas is changed relative to a change in the atmospheric pressure and the partial pressure of the reactive gas is maintained constant.

In another particular form of the method, a flow rate of the reactive gas is changed relative to a change in the atmospheric pressure and the partial pressure of the reactive gas is maintained constant.

In a further particular form of the method, a flow rate of one of the reactive and inert gases is regularly changed relative to a change in the atmospheric pressure and a flow rate of the other one of the reactive and inert gases is changed relative to a change in the flow rate of the one of the reactive and inert gases and a change in the atmospheric pressure whilst the partial pressure of the reactive gas is maintained constant.

According to another aspect of the present invention, there is provided an apparatus for carrying out semiconductor filming, which comprises a reactive gas supply pipe for supplying a reactive gas to a reaction tube, an inert gas supply pipe for supplying an inert gas to the reaction tube, a flow rate adjuster disposed on each of the reactive gas supply pipe and the inert gas supply pipe, a barometer for measuring an atmospheric pressure, and a controller for controlling a flow rate of at least one of the flow rate adjusters based on the measurements of the barometer.

In a particular form of the apparatus, the controller includes an arithmetic means for operating the flow rates of the inert and reactive gases for maintaining a partial pressure of the reactive gas employing as variables a change in the atmospheric pressure, the flow rates of the inert and reactive gases, the partial pressure of the reactive gas and the atmospheric pressure.

DETAILED DESCRIPTION OF THE PREFERRED EMBODIMENT

Preferred embodiment of the present invention will now be explained with reference to the accompanying drawings.

Figure 1:
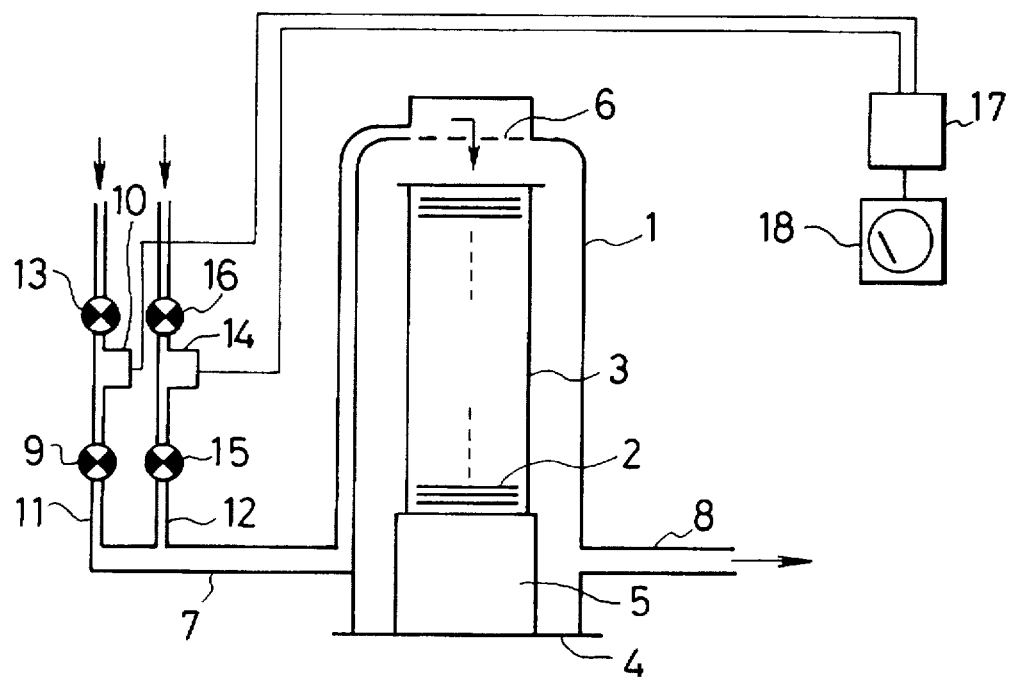
FIG. 1 is a schematic perspective view illustrating an embodiment of the present invention.
Figure 3:
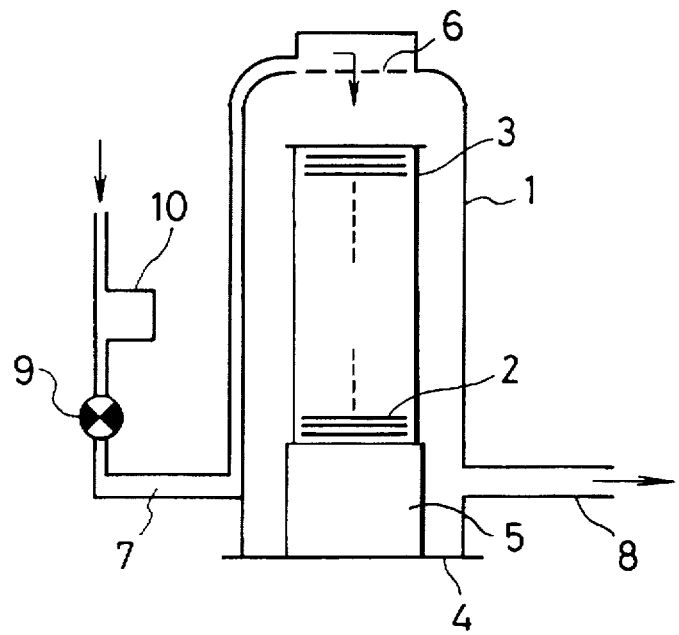
FIG. 3 is a schematic perspective view illustrating a known apparatus.
Figure 4:
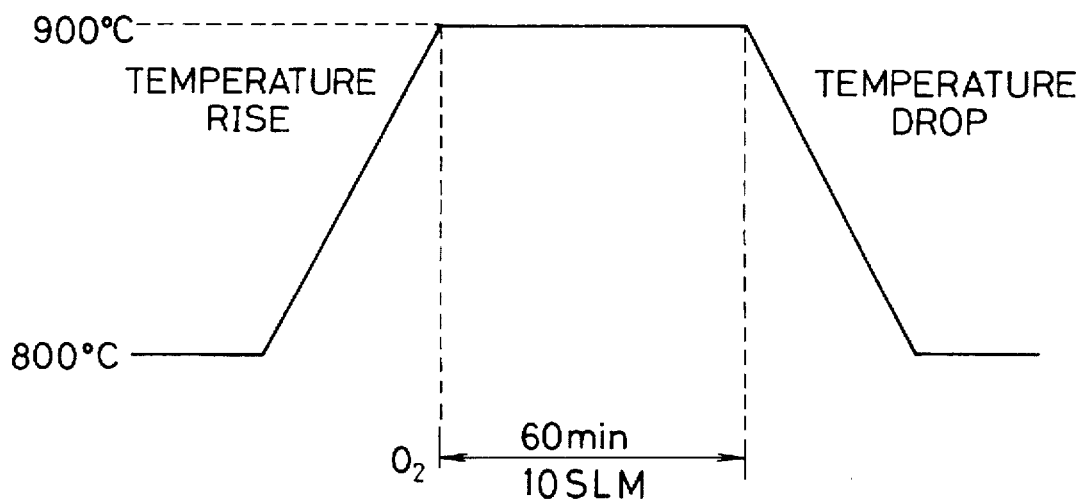
FIG. 4 is a graph illustrating a manner of oxidation film deposition.

In FIG. 1, same reference numerals will be used for corresponding parts shown in FIG. 3.

Inside a reaction tube 1, there is provided a boat 3 carrying a plurality of horizontally oriented wafers 2 laid in a multi-storied fashion. The boat 3 is vertically disposed, via a boat stand 5, on a furnace opening cover 4 which in an airtight manner covers a lower end of the reaction tube 1. In a ceiling of the reaction tube 1, there are provided a plurality of gas introduction holes 6 communicating with a gas introduction pipe 7. An exhaust pipe 8 communicates with the inside of the reaction tube 1 at a lower part thereof. The gas introduction pipe 7 is branched to provide a reactive gas supply pipe 11 connected to an oxygen gas source as a source of reactive gas not shown and an inert gas supply pipe 12 connected to a source of inert gas not shown.

The reactive gas supply pipe 11 has a flow rate adjuster 10. Upstream and downstream of the flow rate of adjuster 10, there are provided a valve 9 and a valve 13, respectively. Similarly, the inert gas supply pipe 12 has a flow rate adjuster 14, upstream and downstream of which there are provided a valve 15 and a valve 16, respectively.

On the inventive apparatus, there is also provided a controller 17 for controlling the flow rates of the flow rate adjusters 10 and 14, in which pressures detected by a barometer 18 are input.

Figure 2:
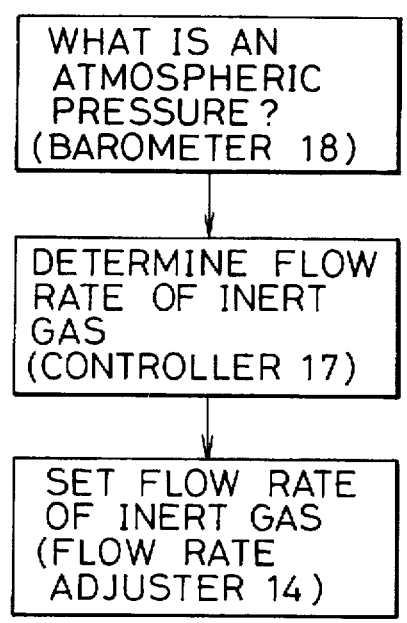
FIG. 2 is a flow chart showing the operation of the embodiment.

Operation of the apparatus will be described hereinbelow with reference to FIG. 2.

The valves 13 and 9 are opened, and the flow rate of the flow rate adjuster 10 is set by means of the controller 17, the oxygen gas at constant flow rate is supplied. Then, the valves 16 and 15 are opened to place the inert gas in condition to be supplied through the gas introduction pipe 7 to the inside of the reaction tube 1, and the flow rate of the flow rate adjuster 14 is set by means of the controller 17. The flow rate setting is performed such that the absolute pressure of the oxygen gas at a reference atmospheric pressure corresponds to a set pressure.

A value indicative of the atmospheric pressure detected by the barometer 18 is input into the controller 17. The controller 17 computes a deviation between the detected atmospheric pressure and reference atmospheric pressure. It then computes the flow rate of the inert gas at which the absolute pressure of the oxygen gas is maintained constant under such deviation and controls the flow rate adjuster 14 to allow flow of the relevant gas at the computed flow rate.

The flow rate of the inert gas may be maintained constant whilst the flow rate of the oxygen gas is varied in correspondence with a change in the atmospheric pressure, maintaining a partial pressure of the oxygen gas constant. Alternatively, the flow rate of one of the inert gas or oxygen gas may be changed regularly, that is, in accordance with a functional equation, and the flow rate of the other gas may be changed relative to that change and a change in the atmospheric pressure.

Relations between the inert gas, oxygen gas, atmospheric pressure and partial pressure of the oxygen gas are represented by Equation 1 and Equation 2, shown below, where the inert gas is x; the oxygen gas is y; the partial pressure of the oxygen gas is z; and the atmospheric pressure is w.

$$x = y(w/z - 1) \quad \text{Equation 1}$$

$$y = x(w/z - 1) \quad \text{Equation 2}$$

These operational equations 1 and 2 are input for presetting the controller 17. The controller 17 performs the required operations, and the flow rate adjusters 10 and 14 are controlled as explained hereunder.

When the flow rates of the oxygen gas and the partial pressure of the oxygen gas are maintained constant, an operation is carried out according to Equation 1, on basis of the detected atmospheric pressure and the preset partial pressure of the oxygen gas, to compute the flow rate of the inert gas. A control signal is then output to the valve 15 to control same to allow the relevant gas to flow at the computed flow rate. As the flow rates of the inert gas and the partial pressure of the oxygen gas are maintained constant, an operation is carried out according to Equation 2, based on the detected atmospheric pressure and preset partial pressure of the oxygen gas, to compute the flow rate of the oxygen gas, whereafter the flow rate adjuster 10 is controlled to allow the relevant gas to flow at the computed flow rate. Where one of the flow rates of the inert and oxygen gases is to be changed regularly, an operation is performed according to either Equation 1 or Equation 2 to obtain a variable for maintaining the partial pressure of the oxygen gas constant.

Table 1 below shows an implementation where the flow rate of the oxygen gas is maintained constant and the partial pressure of oxygen is maintained constant at 900 hpa. The values shown in Table 1 are obtained by Equation 1 above.

TABLE 1

|   | ATMOSPHERIC PRESSURE [hpa] | OXYGEN FLOW RATE [SLM] | INERT GAS FLOW RATE [SLM] | OXYGEN PARTIAL PRESSURE [hpa] |
|---|---|---|---|---|
| 1 | 1,000 | 9 | 1 | 900 |
| 2 | 980 | 9 | 0.8 | 900 |
| 3 | 950 | 9 | 0.5 | 900 |

As is now apparent, notwithstanding occurrence of a change in the atmospheric pressure, it is possible to maintain the partial pressure of the oxygen gas constant by changing the flow rate of the inert gas. Further, since the pressure inside the reaction tube is kept substantially equal to the atmospheric Pressure, existing oxidation furnaces can also be used as they are.

Next, in a first way of controlling the inventive apparatus, the atmospheric pressure is firstly detected by the barometer 18 prior to treatment of the wafer 2 or during a predetermined time period of wafer insertion and completion of the temperature rise. Then, the flow rates of the inert and oxygen gases being processed for maintaining the partial pressure of the oxygen gas at the preset value are computed, the flow rates being maintained constant during the process.

In a second way of controlling the apparatus, additionally to the first way, a value detected by the barometer 18 may be input to adjust the flow rates at least once during the wafer treatment. In a third way of controlling the apparatus, the flow rates may be adjusted intermittently by inputting values detected by the barometer 18 at predetermined time intervals. Alternatively, the flow rates may be adjusted continuously by continuously inputting values detected by the barometer 18. Selection of these ways of controlling the apparatus depends on factory locations. For example, in districts experiencing a diversity of weather changes, the third way of controlling the apparatus may be desirable as the atmospheric pressure is likely to change. The first and second ways of controlling the apparatus may be suited to districts with little atmospheric pressure changes.

With the inventive system thus arranged, it is possible not only to avoid discrepancies between or errors in treatment conditions due to regional differences, e.g., altitudinal differences of factory locations but also to avoid errors in batches of treatment, apparatuses and factories whilst achieving compatibility of treatment data.

As it may readily be appreciated by those of ordinary skill in the art, the present invention should not be limited to use on an oxidation apparatus but it may also be applied to a phosphorus diffusion apparatus, a PYRO oxidation (hydrogen gas burning oxidation) apparatus, a hydrogen chloride oxidation apparatus, etc. when an inert gas is additionally used and a reactive gas and a partial pressure of an oxidation gas are controlled, thus achieving stability in product quality.

Since, as thus far explained, the absolute pressure of a reactive gas can be maintained constant in the apparatus according to the present invention, it achieves deposition of thin films of uniform film thickness and quality and hence provides products of improved quality and improved reproductiveness. Further, since the internal pressure of a reaction chamber may be kept substantially equal to an atmospheric pressure, existing oxidation furnaces may be used as they now stand, without making any alterations thereto.

What is claimed are:

1. A method of semiconductor filming wherein a thin film is deposited on a wafer under an atmospheric pressure, comprising the steps of:

simultaneously supplying a reactive gas and an inert gas to a reaction tube; and maintaining a partial pressure of said reactive gas constant by adjusting flow rates of said reactive gas and said inert gas.

2. A method of semiconductor filming according to claim 1, wherein a flow rate of said inert gas is changed relative to a change in said atmospheric pressure while said partial pressure of said reactive gas is maintained constant.

3. A method of semiconductor filming according to claim 1, wherein a flow rate of said reactive gas is changed relative to a change in said atmospheric pressure while said partial pressure of said reactive gas is maintained constant.

4. A method of semiconductor filming according to claim 1, wherein a flow rate of one of said reactive and inert gases is changed relative to a change in said atmospheric pressure and a flow rate of the other one of said reactive and inert gases is changed relative to a change in the flow rate of said one of said reactive and inert gases and a change in said atmospheric pressure whilst said partial pressure of said reactive gas is maintained constant.

5. A method of semiconductor filming according to claim 1, wherein the flow rates of said reactive and inert gases are determined based on said atmospheric pressure measured prior to the film deposition process with respect to said wafer and are maintained constant at those flow rates during the film deposition process.

6. A method of semiconductor filming according to one of claims 2–4, wherein sa id atmospheric pressure is measured at least once prior to and during the film deposition process with respect to said wafer, the flow rates of said reactive and inert gases are determined relative to the measurements of said atmospheric pressure, and the flow rates of said reactive and inert gases are maintained constant during the film deposition process.

7. A method of semiconductor filming according to one of claims 2–4, wherein said atmospheric pressure is measured continuously and the flow rate of at least one of said reactive and inert gases is changed continuously relative to the measurements of said atmospheric pressure.

* * * * *